United States Patent [19]

Ueda et al.

[11] Patent Number: 5,025,307
[45] Date of Patent: Jun. 18, 1991

[54] MODULAR SEMICONDUCTOR DEVICE

[75] Inventors: Tetsuya Ueda; Toru Tachikawa; Masataka Takehara, all of Itami, Japan

[73] Assignee: Mitsubishi Denki Kabushiki Kaisha, Japan

[21] Appl. No.: 501,276

[22] Filed: Mar. 29, 1990

[30] Foreign Application Priority Data

Mar. 30, 1989 [JP] Japan ..................... 1-80486

[51] Int. Cl.$^5$ ..................... H01L 39/02; H01L 23/02; H01L 23/12; H01L 23/16
[52] U.S. Cl. ......................... 357/80; 357/74; 357/75; 357/81; 361/384; 361/396; 361/397; 361/400; 361/404; 361/412
[58] Field of Search ............ 357/80, 81, 74, 75; 361/384, 396, 397, 400, 404, 412, 414

[56] References Cited

U.S. PATENT DOCUMENTS

| 3,246,386 | 4/1966 | Ende | 361/396 |
| 3,535,595 | 10/1970 | Moore | 361/396 |
| 4,790,373 | 12/1988 | Raynor et al. | 165/185 |
| 4,827,328 | 5/1989 | Ozawa et al. | 357/80 |
| 4,837,663 | 6/1989 | Zushi et al. | 361/384 |
| 4,860,163 | 9/1989 | Sarath | 361/384 |

Primary Examiner—Rolf Hille
Assistant Examiner—David Ostrowski
Attorney, Agent, or Firm—Leydig, Voit & Mayer

[57] ABSTRACT

A modular semiconductor device includes a pair of generally parallel electronic circuit boards and a plurality of IC packages mounted between the electronic circuit boards. Two or more modular semiconductor devices may be stacked on each other so that memory capacity can be readily enlarged and the function level can be readily improved. A heating, radiating fin of planar or honeycomb structure may be provided in near contact with an IC package.

12 Claims, 16 Drawing Sheets

F I G. 13
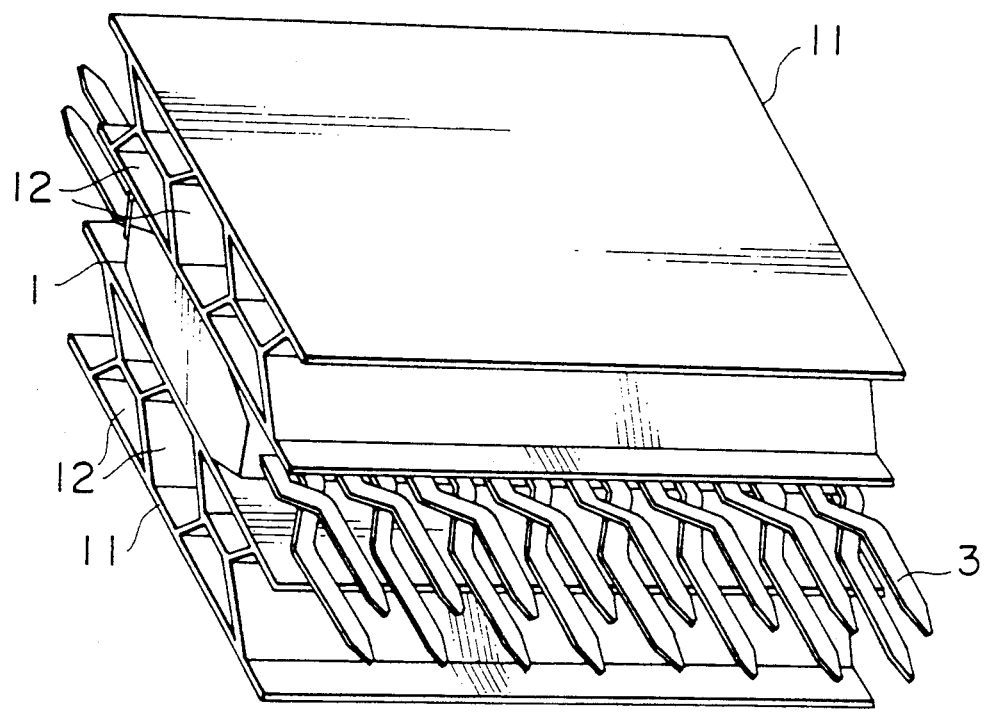

MODULAR SEMICONDUCTOR DEVICE

BACKGROUND OF THE INVENTION

1. Field of the Invention

The present invention relates to a modular semiconductor device comprising a plurality of collectively mounted IC packages.

2. Description of the Related Art

FIG. 1 is a partially broken away perspective view which illustrates a package called an SOP (Small Outline Package) for conventional semiconductor devices usually called ICs.

FIGS. 2A to 2E illustrate a conventional hybrid integrated circuit device called a module employing the SOP-type IC package. FIG. 2A is a top view, FIG. 2B is a front elevational view, FIG. 2C is a side elevational view, FIG. 2D is a bottom view, and FIG. 2E is an enlarged view which illustrates the portion A of FIG. 2C.

Referring to FIG. 1, an IC package 1 includes a semiconductor chip 2, leads extending outwardly from the semiconductor chip 2, and the like are sealed by resin 4 and outer leads 3 to be connected to external equipment (omitted from illustration) extend outwardly from the resin. Referring to FIGS. 2A to 2E, a hybrid IC semiconductor device 5 called the module is constituted by mounting, on an electronic circuit board 6, a plurality of the IC packages 1 and other chip parts 7, such as chip resistors, chip condensers, and the like. A land 8 formed on the electronic circuit board 6 has an electrode 8a for mounting the IC packages and chip parts 7 and also has an external I/O electrode 8b for establishing an electrical connection between the electronic circuit board 6 and external equipment. A chip lead 9 supports the module 5 on the external equipment or on an external board and also establishes an electrical connection of the above-described components. The clip lead 9 comprises a clip portion 9a connected to the external I/O electrode 8b and clipped to the electronic circuit board 6 and a lead portion 9b to be inserted into an electrode or a through hole of the external equipment or the external board. Solder 10 establishes an electrical connection between the outer lead 3 of the IC package 1 or the electrode of the chip parts 7 and the electrode 8a on the electronic circuit board 6 or a connection between the external I/O electrode 8b on the substrate 6 and the clip lead 9.

As a result of the structure of the conventional module 5 comprising a conductor pattern (omitted from illustration) made of copper foil or the like, the IC package 1 and the chip components 7, each of which is formed on the electronic circuit board 6, a function which has been impossible for a single IC package 1 to possess is produced. For example, the conventional module 5 can be used as a semiconductor device having a memory or the like whose storage capacity has been enlarged or used as a semiconductor device comprising a plurality of IC packages 1 of different types and thereby having hybrid functions.

However, since the conventional modular semiconductor device is structured as described above, the ICs 1 and the chip parts 7 are able to be mounted on only obverse and reverse sides of the electronic circuit board 6. In the present electrical and electronic industries, the mounting density (usually called the packaging density) of the ICs 1 and the chip parts 7 is desired to be increased. However, the packaging density on the conventional module 5 can, at most, be tripled since the ICs 1 and the chip component 7 can be mounted only on both sides of the module 5. Therefore, packaging density of conventional modules is limited.

In addition, it has been difficult for a user to enlarge the memory capacity of the conventional modules and to expand the functions of the same. For example, the module 5 must be replaced in the above-described case because the user cannot expand it.

SUMMARY OF THE INVENTION

A first object of the present invention is to provide a modular semiconductor device overcoming the above-described problems and achieving high packaging density which has been difficult for the conventional modules.

A second object of the present invention is to provide a modular semiconductor device whose memory capacity or function level can be easily enlarged or raised by a user.

A third object of the present invention is to provide a modular semiconductor device which can be efficiently cooled.

A fourth object of the present invention is to provide a modular semiconductor device with a heat radiating fin for further improving cooling efficiency.

The modular semiconductor device according to the first embodiment of the present invention includes at least one pair of electronic circuit boards which are parallel to each other or, external equipment or on an external board and a circuit comprising each of the electronic circuit boards, IC packages, and chip components mounted between the two or more electronic circuit boards.

The modular semiconductor device according to the second embodiment of the present invention includes two or more modular semiconductor devices according to the first embodiment of the present invention are stacked perpendicularly to the external equipment so that the memory capacity can be readily enlarged and the function level can be easily improved. The electronic circuit board perpendicularly mounted on the external equipment or the external board is provided with a plurality of external I/O electrodes along a side adjacent the external equipment or the external board and is further provided with a plurality of expansion electrodes on its opposite side. The thus constituted electronic circuit board and clip leads provided with clip portions having openings facing outside on two end portions enable a plurality of electronic circuit boards to be mounted perpendicularly to the external equipment or the external board.

The modular semiconductor device according to the third embodiment and the fourth embodiment of the present invention is arranged in such a manner that gas is allowed to flow by, for example, an air blower to the portion between the at least one pair of parallel electronic circuit boards. Furthermore, a radiating fin having a honeycomb structure having through holes extending in a direction in which the gas flows is provided to closely contact the IC package. Therefore, an air flow is created between electronic circuit boards of the modular semiconductor device. As a result, heat generated due to the operations of the IC package or the like is discharged outside so that the overall module operates normally.

Other and further objects, features, and advantages of the invention will be appear more fully from the following description.

BRIEF DESCRIPTION OF THE DRAWINGS

FIG. 13 is a perspective view which illustrates the IC package shown in FIGS. 12A and 12C;

DESCRIPTION OF THE PREFERRED EMBODIMENTS

An embodiment of the present invention will now be described.

Figure 3:
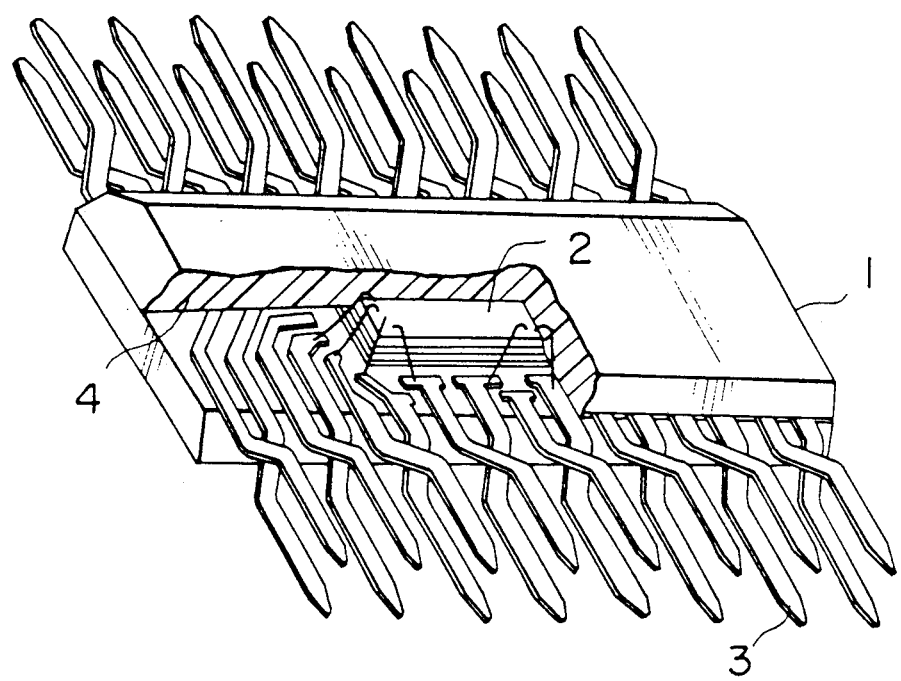
FIG. 3 is a partially broken away perspective view which illustrates an IC package for use in a module-type semiconductor device according to the present invention.

FIGS. 3 to 5B illustrate a first embodiment of a modular semiconductor device according to the present invention. Referring to these drawings, the same reference numerals as those according to the conventional device represent the same or corresponding elements as those of the conventional device. FIG. 3 illustrates an example of the IC package 1 for establishing an electrical connection between two electronic circuit boards 6 of the modular semiconductor device according to the first embodiment of the present invention. The IC package 1 is structured in such a manner that the leads of a conventional IC package 1 having usual bidirectional leads are deformed to become similar to those of a so-called ZIL (Zig zag In Line)-type package.

Figure 4A:
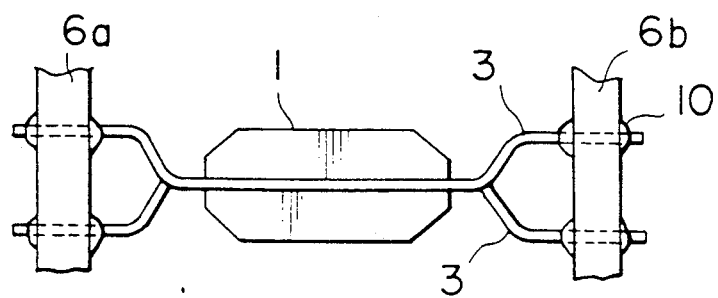
FIGS. 4A to 4C are a front elevational view, a top view, and a side elevational view which illustrate a mounting of the IC package shown in FIG. 3.
Figure 4B:
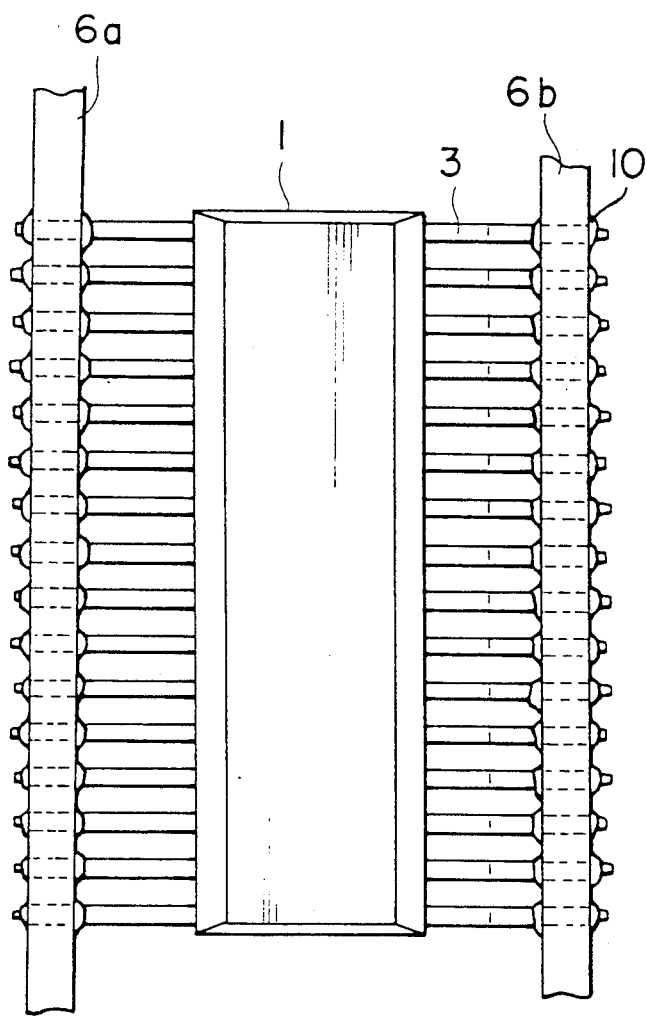
Figure 4C:
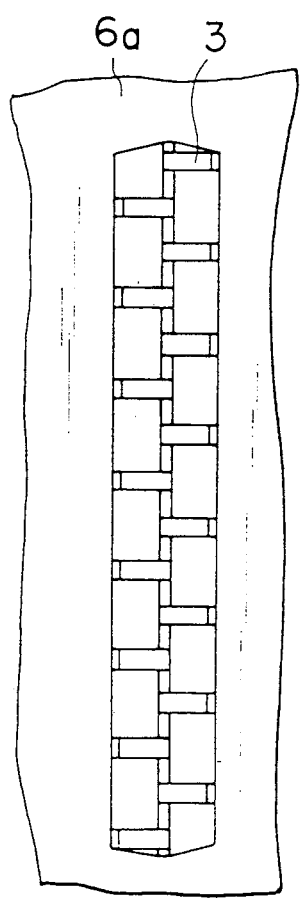

The IC package 1 shown in FIG. 3 is mounted as shown in FIGS. 4A to 4C. FIGS. 4A to 4C illustrate the IC package 1 shown in FIG. 3 mounted on two electronic circuit boards 6a and 6b that are parallel to each other; FIG. 4A is a front elevational view, FIG. 4B is a top view, and FIG. 4C is a side elevational view which illustrate a state in which the electronic circuit board 6b has been omitted.

Figure 5A:
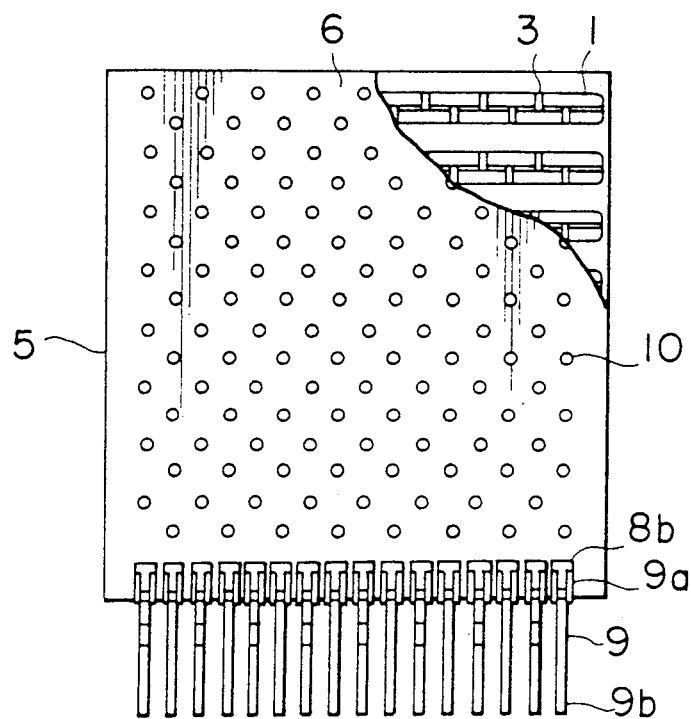
FIGS. 5A and 5B are a front elevational view and a side elevational view which illustrate a first embodiment of the modular semiconductor device according to the present invention.
Figure 5B:
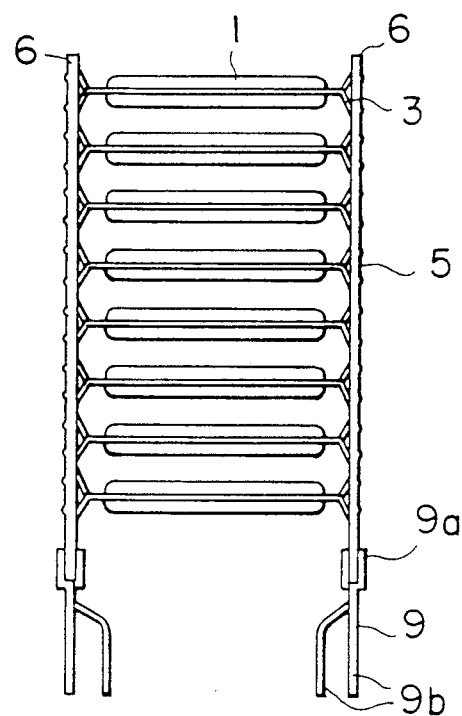

FIGS. 5A and 5B illustrate the modular semiconductor device according to the first embodiment of the present invention manufactured by a mounting method similar to that shown in FIGS. 4A to 4C, where FIG. 5A is a partially broken away front elevational view and FIG. 5B is a side elevational view.

As shown in FIGS. 5A and 5B, the two parallel electronic circuit boards 6 of the modular semiconductor device according to the present invention are mounted on external equipment or an external board (omitted from illustration). Furthermore, for, example, eight IC packages 1 as shown in FIG. 3 are mounted perpendicularly to the above-described two electronic circuit boards 6. As a result, a large number of, for example, eight times the number of, electronic components can be mounted on the same area of an external equipment or an external board.

Furthermore, the circuit can be constituted in such a manner that the two electronic circuit boards 6, the IC package 1, and the chip parts 7 on the electronic circuit boards 6 are included. Therefore, a module which is not the module formed by merely stacking eight IC packages 1 but comprising various electronic elements as the chip components 7 and thereby having various functions can be obtained.

Figure 6A:
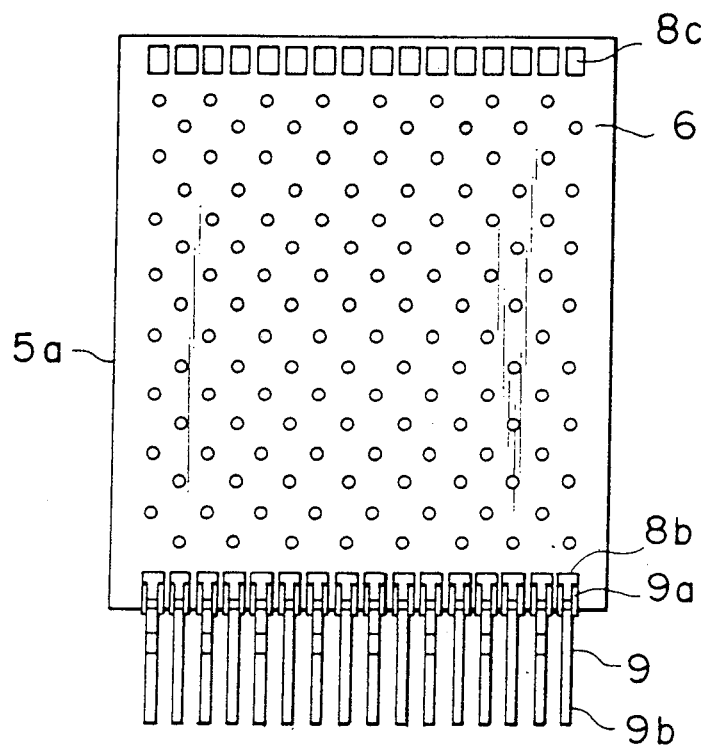
FIGS. 6A and 6B are a front elevational view and a side elevational view which illustrate a unit semiconductor device module in the lower portion of the modular semiconductor device according to a second embodiment of the present invention shown in FIGS. 8A and 8B.
Figure 6B:
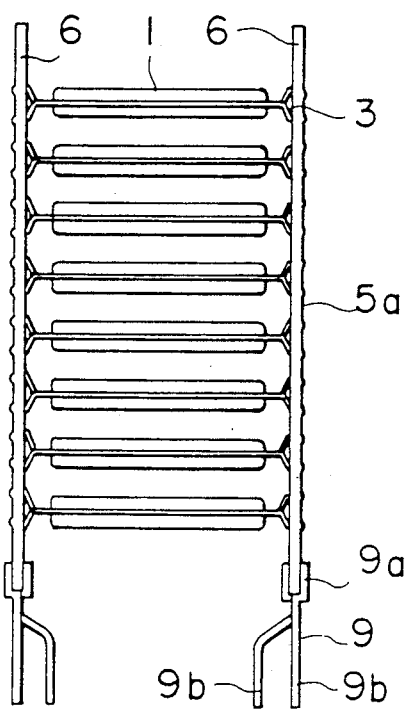

FIGS. 6A to 8B illustrate a second embodiment of the modular semiconductor device according to the present invention. FIGS. 6A and 6B are a partially broken away front elevational view (FIG. 6A) and a side elevational view (FIG. 6B) which respectively illustrate a semiconductor device module 5a in the lower portion of the overall modular semiconductor device according to the second embodiment of the present invention shown in FIGS. 8A and 8B. The semiconductor device module 5a has a plurality of external I/O electrodes 8b arranged in line along the lower side thereof adjacent to an external equipment on which the semiconductor device module 5a is to be mounted, the plurality of the external I/O electrodes 8b being provided for the purpose of establishing electrical connections to the external equipment. Furthermore, the semiconductor device module 5a has a plurality of expansion electrodes 8c on the upper side for the purpose of establishing electrical connections to the upper semiconductor device when a plurality of the semiconductor devices are stacked. In addition, clip leads 9 are connected to the corresponding external I/O electrodes 8b. The clip lead 9 comprises a clip portion 9a having an opening portion facing outwards in the longitudinal direction of the clip lead 9 and holding the electrode 8b in cooperation with the electronic circuit board 6 and a lead portion 9b extending from the clip portion 9b. The lead portion 9b includes straight components extending downwards and offset components which are arranged alternately so that the semiconductor device modules 5a and 5b are electrically connected to the external equipment and are secured to the same.

Figure 7A:
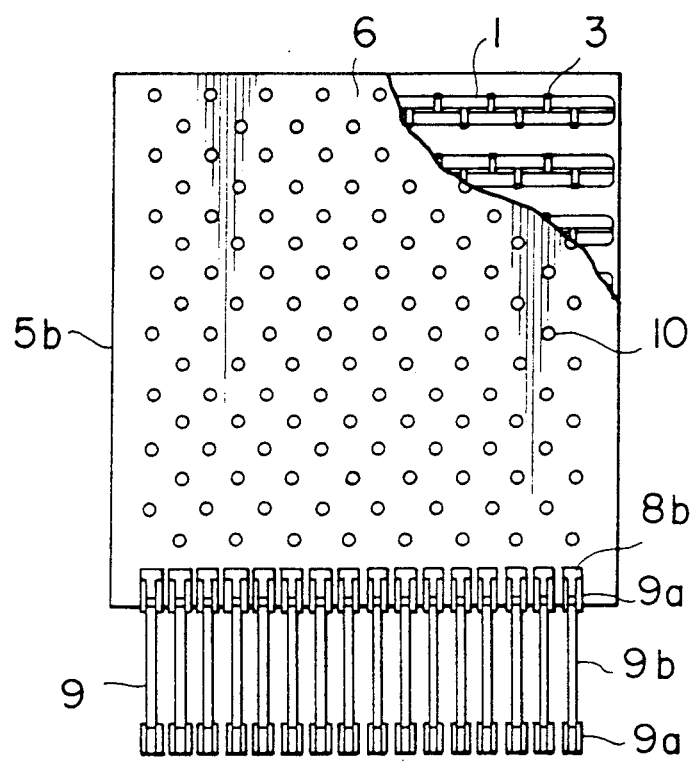
FIGS. 7A and 7B are a front elevational view and a side elevational view which illustrate a unit semiconductor device module in the upper portion of the modular semiconductor device according to a second embodiment of the present invention shown in FIGS. 8A and 8B.
Figure 7B:
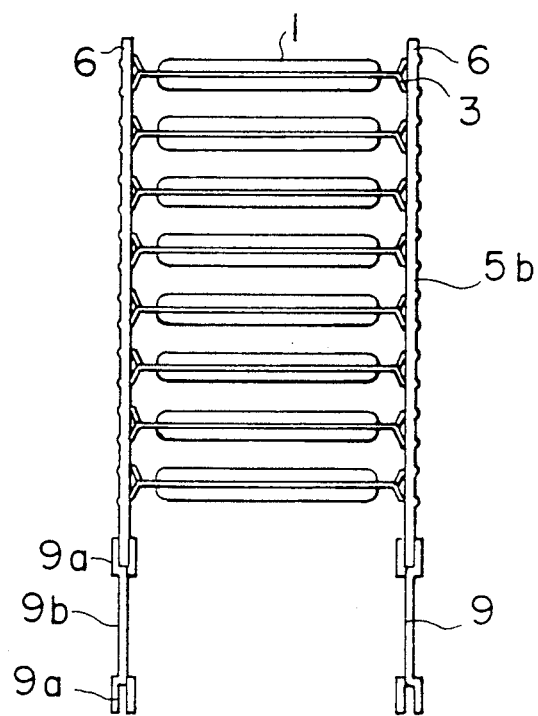
Figure 8A:
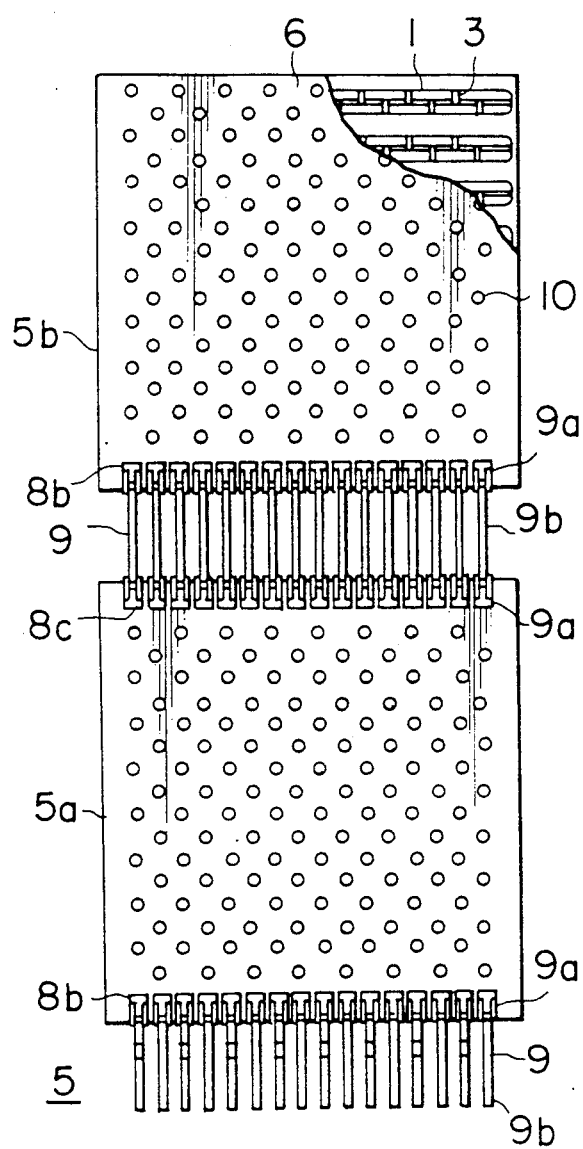
FIGS. 8A and 8B are a front elevational view and a side elevational view which illustrate a second embodiment of the present invention of the modular semiconductor device according to the present invention.
Figure 8B:
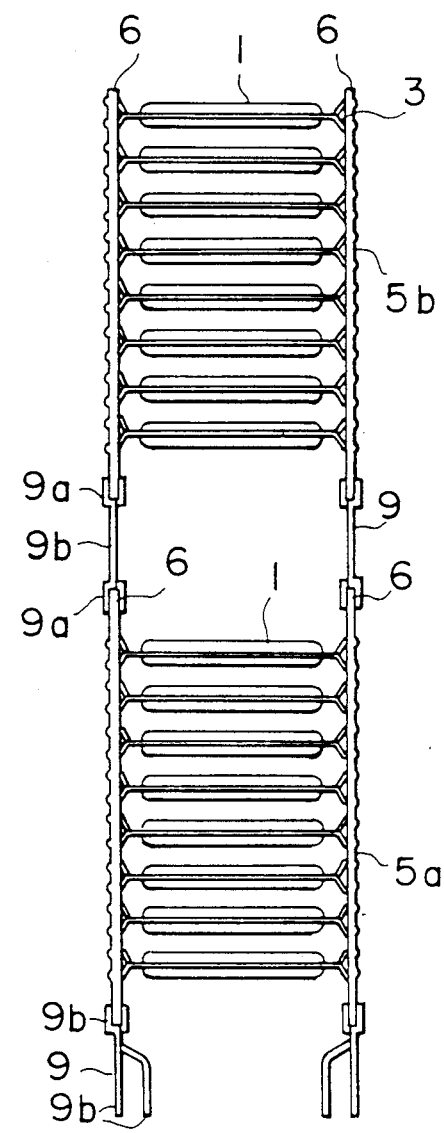

FIGS. 7A and 7B are a partially broken away front elevational view (FIG. 7A) and a side elevational view (FIG. 7B) which respectively illustrate the semiconductor device module 5b of the overall modular semiconductor device shown in FIGS. 8A and 8B. The semiconductor device module 5b has a plurality of external I/O electrodes 8b arranged in line along the lower side adjacent the semiconductor device module 5a. When the semiconductor device module 5b is stacked on the semiconductor device module 5a shown in FIGS. 6A and 6B, the plurality of external I/O electrodes 8b establish electrical connections to the semiconductor device module 5a. The clip leads 9 are connected to the corresponding external I/O electrodes 8b. Each of clip leads 9 comprises clip portion 9a similar to those shown in FIGS. 6A and 6B on the two sides of the lead portion 9b which are planar FIGS. 8A and 8B are a partially broken away front elevational view (FIG. 8A) and a side elevational view (FIG. 8B) which illustrate the semiconductor device module 5b shown in FIGS. 7A and 7B stacked on the semiconductor device module 5a shown in FIGS. 6A and 6B.

As shown in FIGS. 8A and 8B, the expansion electrode 8c and the clip leads 9 have the clip portions 9a provided on two sides thereof. Therefore, the modular semiconductor device 5 can be obtained in which the unit modular semiconductor device modules 5a and 5b are perpendicularly stacked, in line, on external equipment or an external board. In this modular semiconductor device 5, an optional number of the semiconductor devices can be stacked and mounted. Therefore, desired memory capacity or desired functions can be obtained. As a result, the memory capacity can be easily enlarged and improved functions can be readily achieved.

According to this embodiment, the modular semiconductor device includes an IC comprising bidirectional ZIL-type packages as shown in FIGS. 3 to 5B and according to the first embodiment. The second embodiment may be applied to ICs comprising ordinary ZIL-type packages or hybrid ICs including SIL (Single In Line)-type packages.

When the modular semiconductor devices are arranged in the above-described high-density mounting, efficient heat radiation must be achieved since the heat generated by the modular device is large even though each of the IC packages 1 generates a small small amount of heat. Furthermore, in high speed ICs such as ECLs (Emitter Coupled Logic), BI-CMOSs, or the like capable of meeting the desire for high speed ICs that has arisen in recent years, heat radiation is a critical factor since each IC generates a large amount of heat.

Figure 9A:
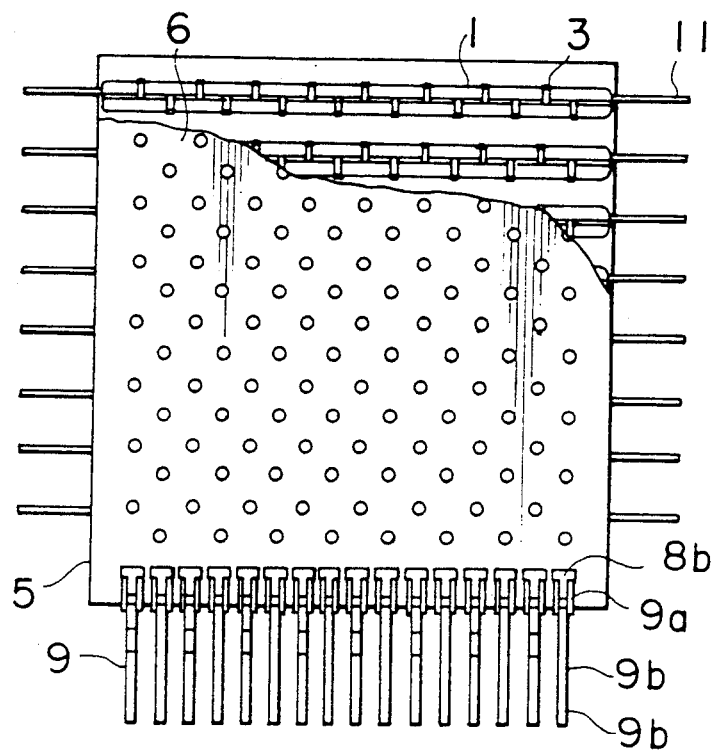
FIGS. 9A and 9B are a front elevational view and a side elevational view which illustrate the modular semiconductor device according to the first embodiment of the present invention shown in FIGS. 5A and 5B and provided with a conventional radiating fin.
Figure 9B:
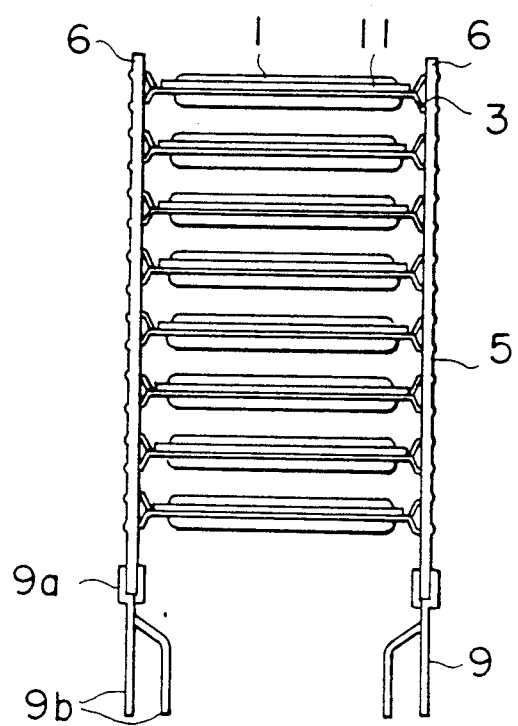
Figure 10:
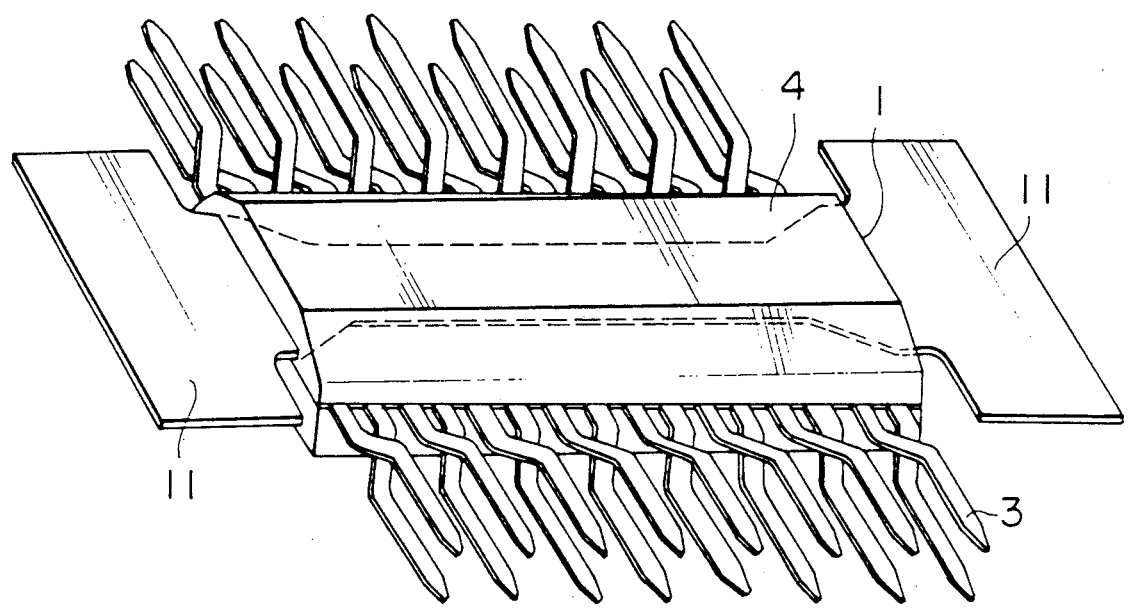
FIG. 10 is a perspective view which illustrates an IC package provided with the radiating fin shown in FIGS. 9A and 9B.

FIGS. 9A and 9B are a partially broken away front elevational view (FIG. 9A) and a side elevational view (FIG. 9B) which illustrate natural heat-radiation in the modular semiconductor device according to the second embodiment of the present invention by means of a heat radiating fin 11 provided for each of the IC packages 1. The IC package 1 provided with the heat radiating fin 11 is shown in perspective in FIG. 10. In the package 1 shown in FIG. 10, a great portion of the heat generated from the included semiconductor chip is radiated outwards through the heat radiating fin 11. However, a certain portion of the heat is emitted through the molding resin 4. Therefore, in the modular semiconductor device 5 as shown in FIGS. 9A and 9B, heat accumulation inevitably takes place in the central portion of the modular semiconductor device 5 produces a a great deal of heat. Therefore, there is a fear of malfunctions of the IC package 1 in the vicinity of the central portion of the modular semiconductor device 5 due to the above-described heat.

Figure 11A:
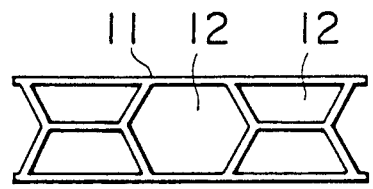
FIGS. 11A to 11C are a front elevational view, a top view, and a side elevational view which illustrate a radiating fin employed in the modular semiconductor device according to a third and a fourth embodiment of the present invention.
Figure 11B:
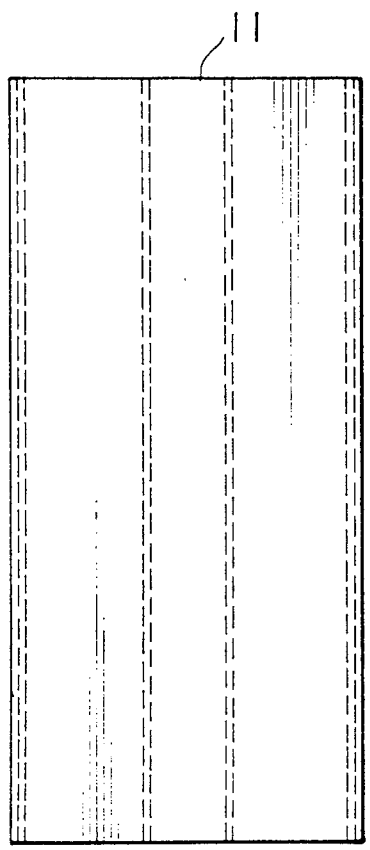
Figure 11C:
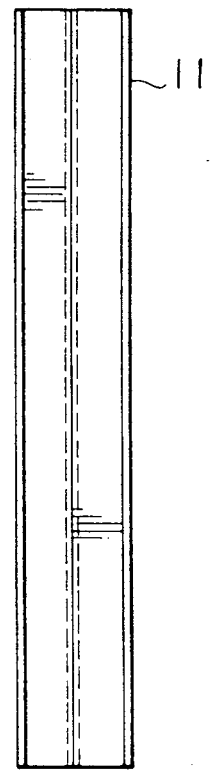

In order to overcome the above-described problems due to heat, the radiating fin 11 according to a fourth embodiment of the present invention, for example, shown in FIGS. 11A to 11C, is employed. The radiating fin 11 is in the form of a honeycomb shape having through holes 12 extending, for example, in the longitudinal direction. Since air flows through the through holes 12, the radiating fin 11 can be cooled.

Figure 12A:
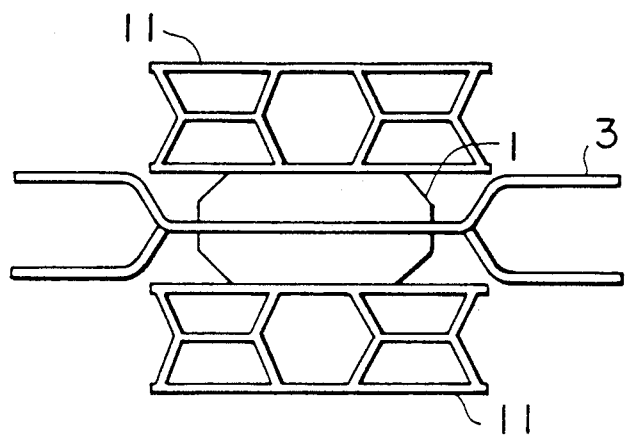
FIGS. 12A to 12C are a front elevational view, a top view, and a side elevational view which illustrate the IC package shown in FIG. 3 and provided with, on the two sides thereof, the radiating fin shown in FIGS. 11A to 11C.
Figure 12B:
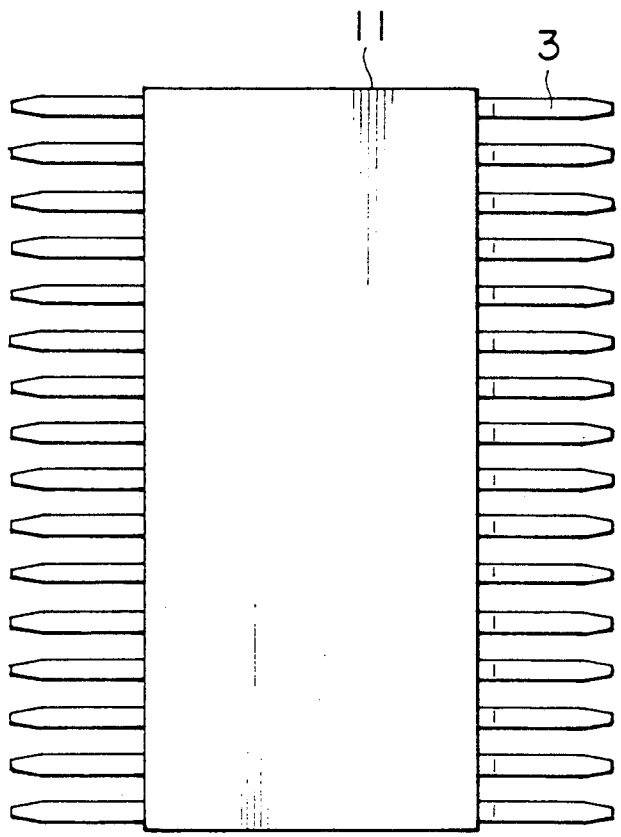
Figure 12C:
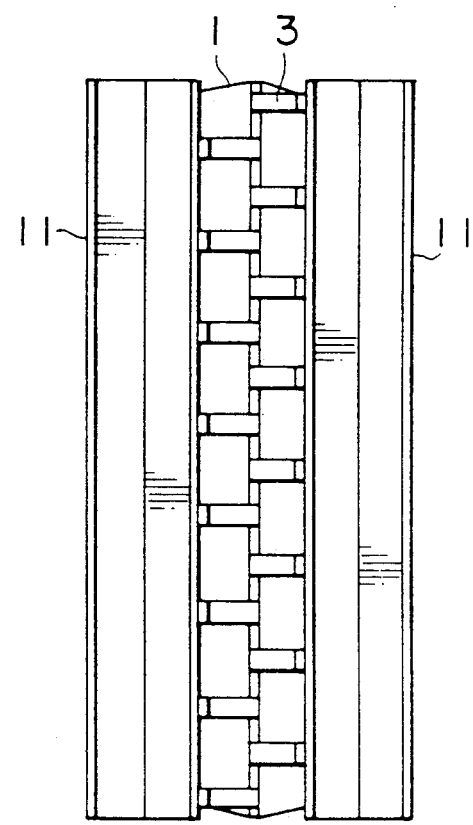
Figure 14A:
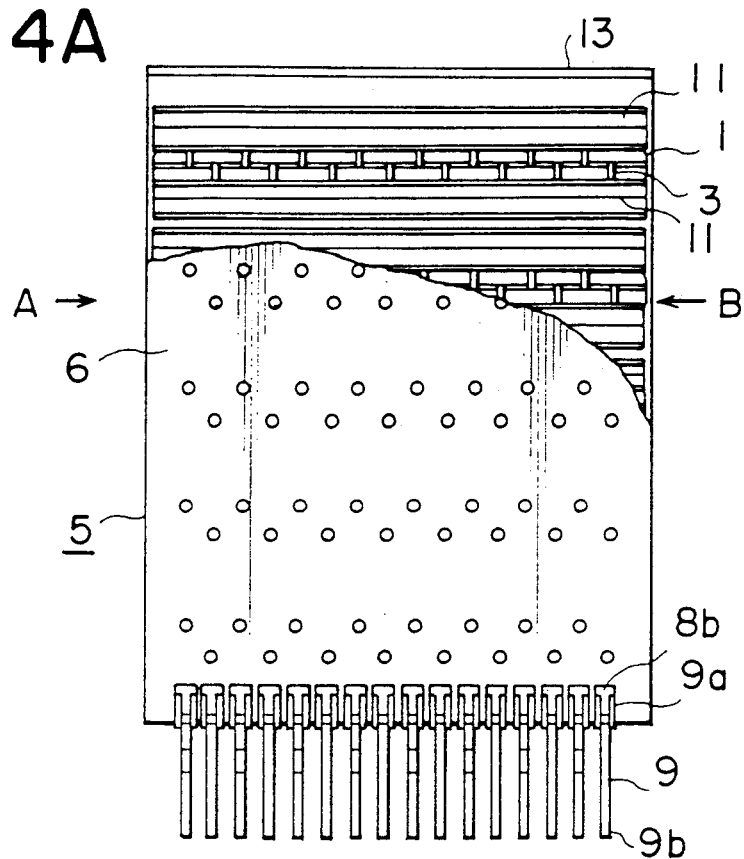
FIGS. 14A and 14B are side elevational views which illustrate the third and the fourth embodiments of the modular semiconductor device according to the present invention.
Figure 14B:
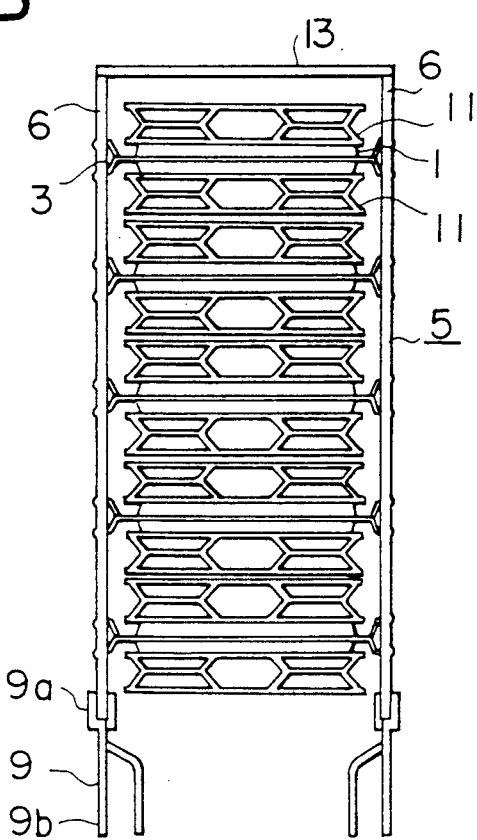

The IC package 1 provided with the radiating fins 11 according to the fourth embodiment of the present invention is shown in FIGS. 12A to 13. FIG. 12A is a front elevational view, FIG. 12B is a top view, FIG. 12C is a side elevational view, and FIG. 13 is a perspective view. The radiating fins 11 are secured to two sides of the IC package which do not obstruct the establishment of the connections of the outer leads 3 and have, a wide area, the radiating fins 11 being secured by an adhesive or the like having a high thermal conductivity. FIGS. 14A and 14B illustrate the fourth embodiment of the present invention applied to the modular semiconductor device according to the first embodiment of the present invention and shown in FIGS. 5 and 5B. In the modular semiconductor device shown in FIGS. 14A and 14B, gas is forcibly supplied in a direction designated by an arrow A or B by an air blower (omitted from illustration) so that the modular semiconductor device 5 can be cooled since even the central portion of the modular semiconductor device 5 accumulates heat. According to this embodiment, a cover 13 may be provided between the top ends of two electronic circuit boards 6 to prevent deterioration in the cooling efficiency due to the escape of the gas supplied by the air blower or the like, from the upper portion of the modular semiconductor device 5.

A similar cooling efficiency can be obtained even if no radiating fin is provided by arranging the structure as a third embodiment of the present invention in such a manner that air is supplied between the electronic circuit boards of the module according to the first embodiment of the present invention shown in FIGS. 5A and 5B and between the electronic circuit boards of the module according to the second embodiment of the present invention shown in FIGS. 8A and 8B.

Figure 1:
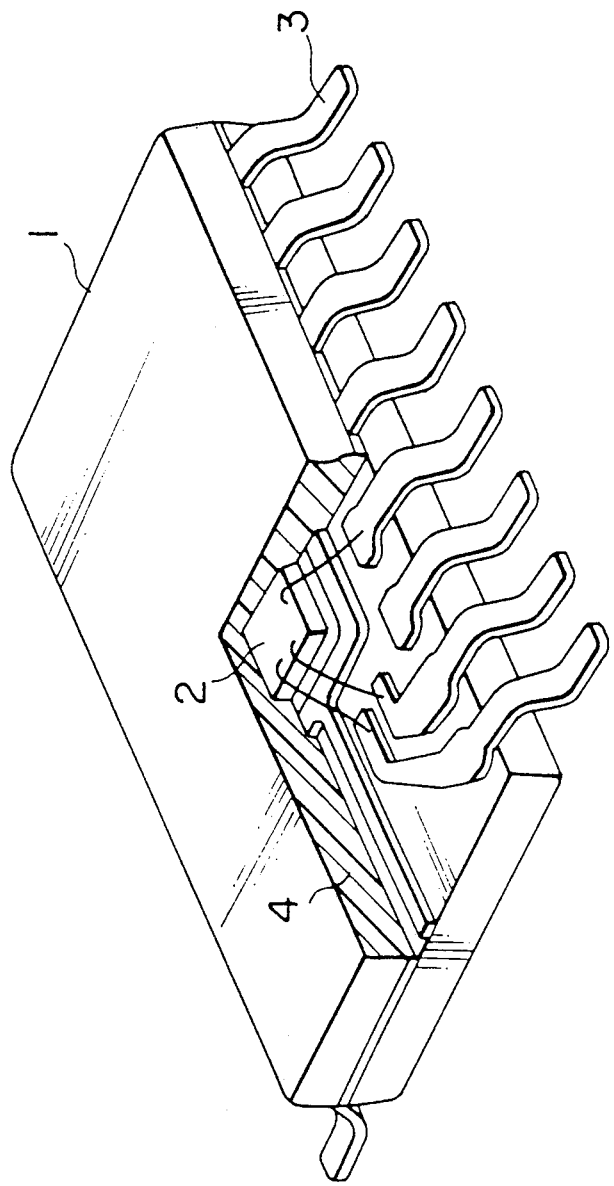
FIG. 1 is a partially broken away perspective view which illustrates a conventional SOP-type IC package.
Figure 2A:
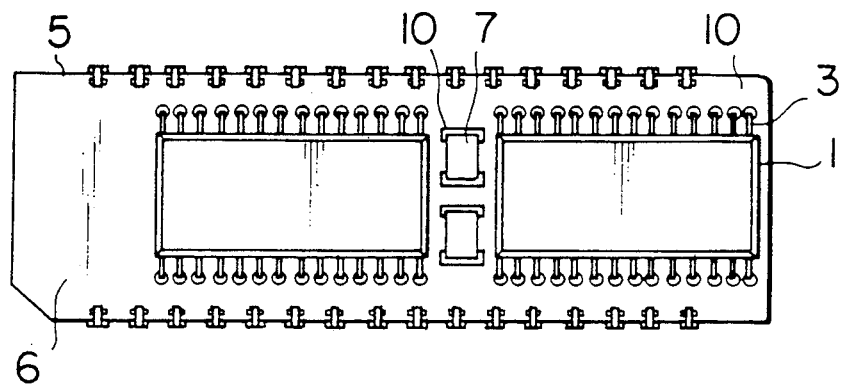
FIGS. 2A to 2E are a top view, a front elevational view, a side elevational view, a bottom view, and a partially-enlarged view, respectively of a conventional modular semiconductor device.
Figure 2B:
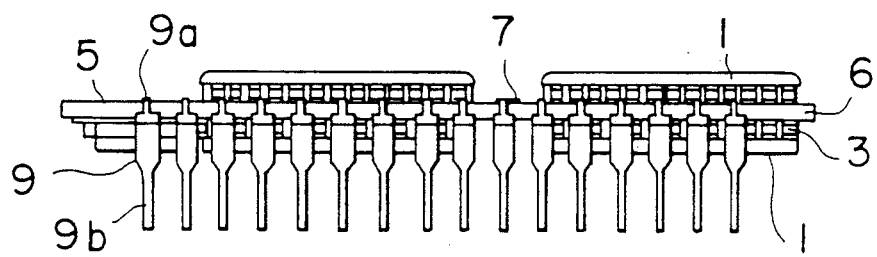
Figure 2C:
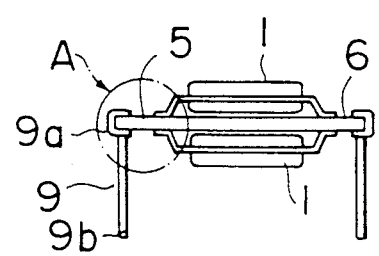
Figure 2D:
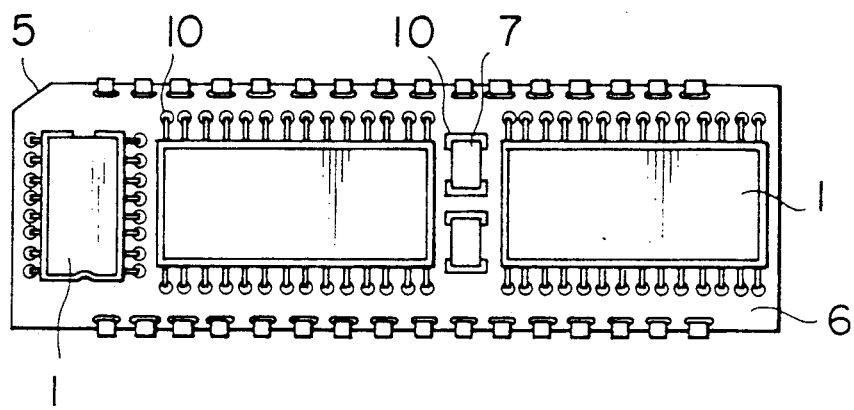
Figure 2E:
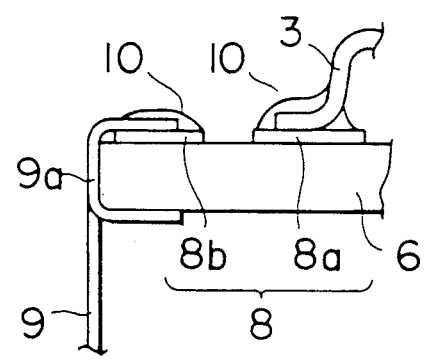
Figure 15:
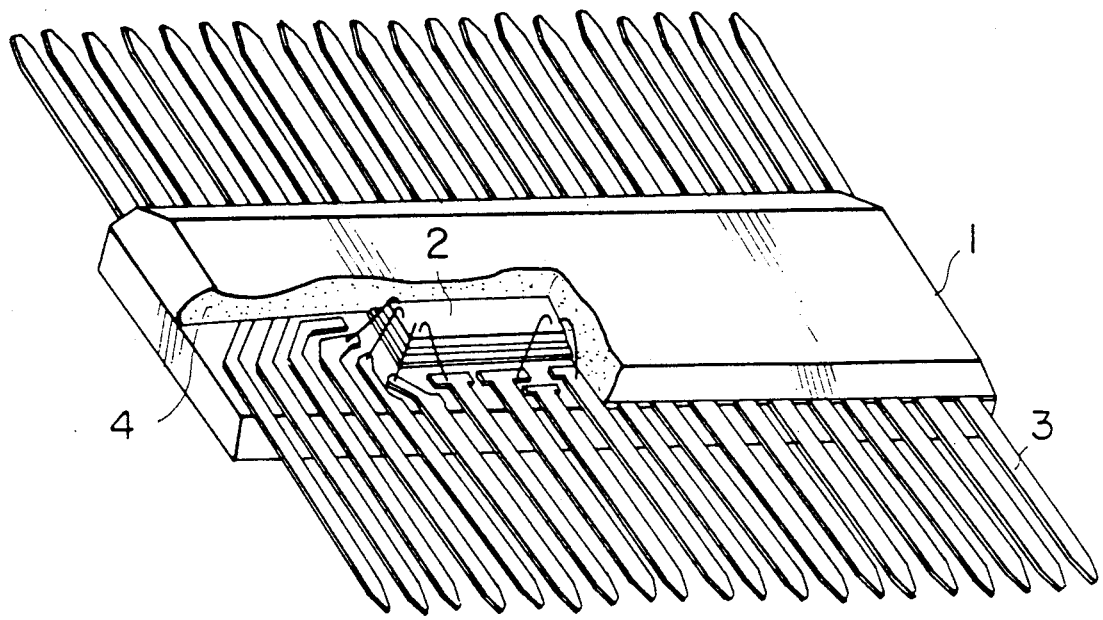
FIG. 15 is a perspective view which illustrates the IC package employed in the modular semiconductor device according to the present invention.
Figure 16:
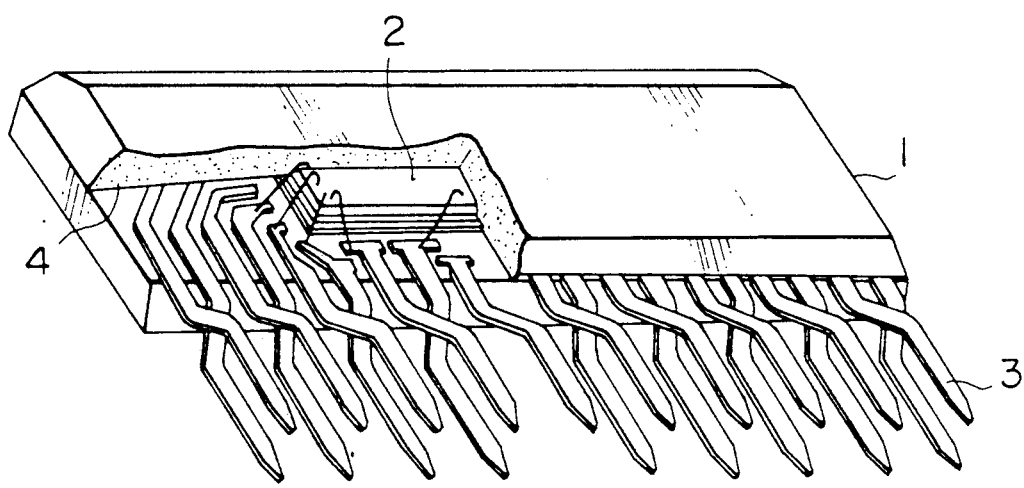
FIG. 16 is a perspective view which illustrates a conventional ZIL-type IC package.

All of the above-described modular semiconductor devices according to the present invention and shown in FIGS. 5A, 5B, 6A, 6B, 7A, 7B, 8A, 8B, 9A, 9B, 14A and 14B respectively comprise an IC package having the bidirectional ZIL-type leads shown in FIG. 3. However, the present invention is not limited to that IC package For example, an IC package having bidirectional SIL-type leads as shown in FIG. 15 may be employed. The present invention includes at least one IC package as shown in FIG. 3 or FIG. 15 mounted between a pair of generally parallel electronic circuit boards. Therefore, for example, an IC package having the ZIL-type lead on either side thereof and shown in FIG. 16 or a conventional SIL-type IC package shown in FIG. 1 may be mounted on the electronic circuit boards.

As described above, according to the first embodiment of the present invention, since the IC package is mounted perpendicularly to a plurality of parallel electronic circuit boards, high density mounting can be achieved.

According to the second embodiment of the present invention, a plurality of the modular semiconductor devices according to the first embodiment are stacked on external equipment or an external board. Therefore, a modular semiconductor device having a larger size than a single modular semiconductor device can be made. Therefore, a module having the desired can be made. Therefore, a module having the desired memory capacity and functions can be arranged by, for example, a user.

According to the third embodiment of the present invention, air is supplied between the parallel electronic circuit boards. Therefore, the inside portion of the modular semiconductor device can be cooled.

According to the fourth embodiment of the present invention, a honeycomb structure radiating fin, having through holes extending in the direction in which air is supplied by an air blower, is positioned near each of the IC packages of the modular semiconductor device. Therefore, the cooling efficiency can be improved.

Although the invention has been described in its preferred form with a certain degree of particularlity, it is understood that the present disclosure of the preferred form may be changed in the details of construction and the combination and arrangement of parts without departing from the spirit and the scope of the invention as hereinafter claimed.

What is claimed is:

1. A modular semiconductor device comprising:
   a first pair of generally parallel first electronic circuit boards, each having first and second edges;
   at least one integrated circuit disposed generally perpendicular to and mechanically and electrically connected to each of said first pair of first electronic circuit boards; and
   first electrical connection means disposed along the first edge of each of said first pair of first electronic circuit boards for establishing electrical connections with external equipment and for supporting said first pair of first electronic circuit boards when connected to external equipment wherein said first electrical connection means comprises a plurality of external electrodes disposed on each of said first electronic circuit boards and a plurality of clip leads, each clip lead including a clip portion contacting one of said external electrodes and engaging one of said electronic circuit boards and a lead portion extending from said clip portion for connection to external equipment, alternating lead portions disposed on each of said first electronic circuit boards being offset from each other.

2. A modular semiconductor device according to claim 1 wherein said first pair of first electronic circuit boards includes second electrical connection means disposed on said second edges of said first pair of first electronic circuit boards for establishing electrical connections with and supporting a second pair of generally parallel second electronic circuit boards having at least one integrated circuit disposed generally perpendicular to said second boards and mechanically and electrically connected to each of them, each second board having at least a first edge.

3. A modular semiconductor device according to claim 2 including a second pair of generally parallel second electronic circuit boards having at least one integrated circuit disposed generally perpendicular to said second boards and mechanically and electrically connected to each of said second boards, each second board having at least a first edge wherein said second electrical connection means comprises a plurality of external electrodes disposed along the second edges of each of said first electronic circuit boards, a plurality of expansion electrodes disposed on the first edges of said second electronic circuit boards, and a plurality of second clip leads, each second clip lead including a lead portion contacting one of said external electrodes of said second electrical connection means disposed along a second edge of one of said first electronic circuit boards and one of said expansion electrodes and a clip portion connected to a lead portion for engaging and supporting one of said first electronic circuit boards.

4. A modular semiconductor device according to claim 3 comprising means for supplying a gas between said first and second pairs of first and second electronic circuit boards to remove heat generated by said integrated circuits.

5. A modular semiconductor device according to claim 4 comprising at least one heat radiating fin disposed along one of at least one of said integrated circuits and having a honeycomb structure having a plurality of through holes extending in the direction of flow of the cooling gas.

6. A modular semiconductor device according to claim 5 wherein at least one of said integrated circuits is a rectangular parallelpiped having two main surfaces and said heat radiating fin is disposed opposite one of said main surfaces of said at least one integrated circuits.

7. A modular semiconductor device according to claim 6 including a cover disposed on said first pair of said first electronic circuit boards to prevent discharge of coolant gas.

8. A modular semiconductor device according to claim 1 comprising at least one heat radiating fin disposed along at least one of said integrated circuits.

9. A modular semiconductor device according to claim 6 comprising at least one heat radiating fin disposed along at least one of said integrated circuits.

10. A modular semiconductor device according to claim 1 wherein at least one of said integrated circuits is a rectangular parallelepiped having two main surfaces and including a heat radiating fin disposed opposite one of said main surfaces of said at least one integrated circuit.

11. A modular semiconductor device according to claim 6 wherein said radiating fin is substantially planar.

12. A modular semiconductor device according to claim 4 wherein said radiating fin is substantially planar.

* * * * *